(12) United States Patent
Takekida

(10) Patent No.: US 8,952,444 B2
(45) Date of Patent: Feb. 10, 2015

(54) SEMICONDUCTOR STORAGE DEVICE AND MANUFACTURING METHOD THEREOF

(75) Inventor: Hideto Takekida, Nagoya (JP)

(73) Assignee: Kabushiki Kaisha Toshiba, Tokyo (JP)

(*) Notice: Subject to any disclaimer, the term of this patent is extended or adjusted under 35 U.S.C. 154(b) by 126 days.

(21) Appl. No.: 13/398,208

(22) Filed: Feb. 16, 2012

(65) Prior Publication Data

US 2012/0211860 A1    Aug. 23, 2012

(30) Foreign Application Priority Data

Feb. 23, 2011   (JP) ................... 2011-037450

(51) Int. Cl.
*H01L 21/764*    (2006.01)
*H01L 21/762*    (2006.01)
*H01L 27/115*    (2006.01)

(52) U.S. Cl.
CPC ........ *H01L 21/76224* (2013.01); *H01L 21/764* (2013.01); *H01L 27/11524* (2013.01)
USPC ........... 257/324; 438/257; 438/201; 438/211; 438/221; 257/314; 257/315

(58) Field of Classification Search
CPC ............ H01L 29/4991; H01L 21/7682; H01L 21/76264
USPC .......... 257/499, 314, 315, 324; 438/201, 211, 438/221, 257
See application file for complete search history.

(56) References Cited

U.S. PATENT DOCUMENTS

| | | | | |
|---|---|---|---|---|
| 2008/0073696 | A1* | 3/2008 | Hazama | 257/316 |
| 2010/0155812 | A1* | 6/2010 | Morikado et al. | 257/316 |
| 2010/0237398 | A1* | 9/2010 | Kamigaichi et al. | 257/316 |
| 2011/0062509 | A1* | 3/2011 | Kato et al. | 257/324 |
| 2011/0254073 | A1 | 10/2011 | Takekida | |

FOREIGN PATENT DOCUMENTS

JP    2009-87986    4/2009

OTHER PUBLICATIONS

U.S. Appl. No. 13/053,924, filed Mar. 22, 2011, Hideto Takekida.

* cited by examiner

*Primary Examiner* — Matthew Landau
*Assistant Examiner* — Damon Hillman
(74) *Attorney, Agent, or Firm* — Oblon, Spivak, McClelland, Maier Neustadt, L.L.P.

(57) ABSTRACT

A semiconductor storage device according to an embodiment comprises active areas on a semiconductor substrate. An element isolation is arranged between the active areas and filled by an insulating film. A plurality of memory cells configured to store data are formed on the active areas. Air gaps are arranged between upper-end edge parts of the active areas where the memory cells are formed and an insulating film in the element isolation.

10 Claims, 5 Drawing Sheets

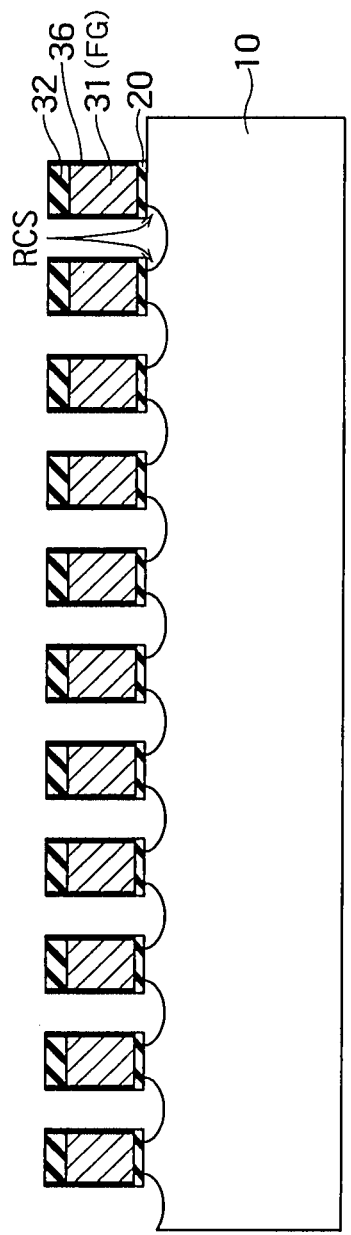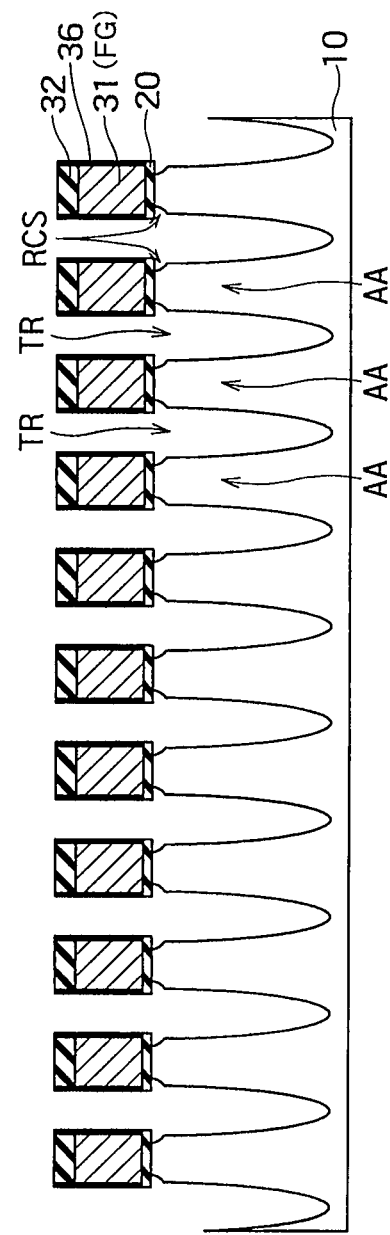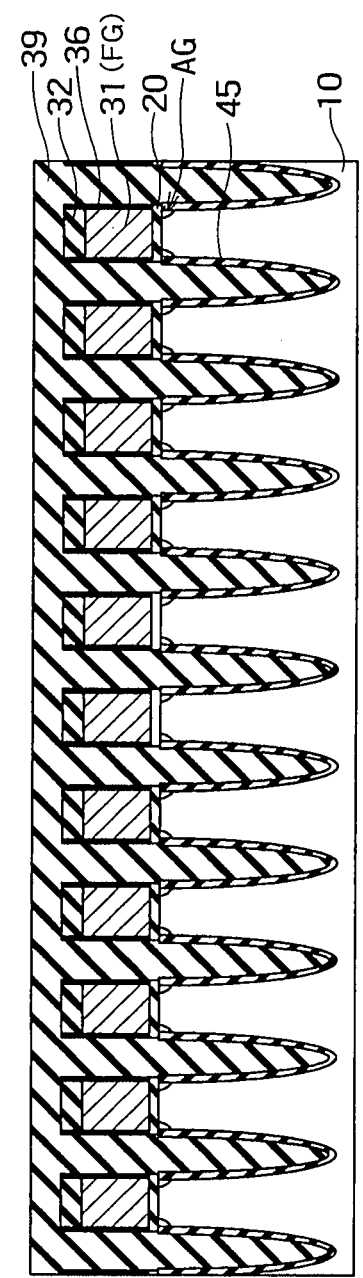

SEMICONDUCTOR STORAGE DEVICE AND MANUFACTURING METHOD THEREOF

CROSS REFERENCE TO RELATED APPLICATIONS

This application is based upon and claims the benefit of priority from the prior Japanese Patent Application No. 2011-37450, filed on Feb. 23, 2011, the entire contents of which are incorporated herein by reference.

FIELD

The embodiments of the present invention relate to a semiconductor storage device and manufacturing method thereof.

BACKGROUND

A NAND flash EEPROM (Electrically Erasable and Programmable Read Only Memory) has been known as a nonvolatile semiconductor storage device that is capable of electrical rewriting and high integration. The NAND flash EEPROM includes a memory cell array region having a plurality of memory cells capable of storing data therein and a peripheral circuit region for controlling memory cell array. STI (Shallow Trench Isolation) is provided as an element isolation between memory cells adjacent to each other in a word line direction.

A trench of STI is sometimes formed continuously in the same process as that of processing a floating gate. In this case, after a tunnel dielectric film is formed on a semiconductor substrate, a material for the floating gate is deposited. Thereafter, the trench of STI is also formed simultaneously with the process of the floating gate. By burying an insulating film in the trench, STI is formed.

When the trench of STI is formed simultaneously with the process of the floating gate as explained above, the number of manufacturing processes can be reduced, but the floating gate, the tunnel dielectric film, and the semiconductor substrate (an active area) are tapered forward. In this case, a bottom surface of the floating gate is inevitably narrower than a top surface of the active area.

A flash memory extracts electric charges in the floating gate by applying a large voltage (for example, 20 V) between the control gate and the semiconductor substrate in a data deletion operation. As explained above, when a large voltage is applied between the semiconductor substrate and the floating gate, a large electric field easily concentrates between a bottom end part of the floating gate and the active area. When the bottom surface of the floating gate is narrower than the top surface of the active area and the bottom end part of the floating gate is on the top surface of the active area as explained above, a larger electric field concentrates on the bottom end part of the floating gate. In this case, electric charges are easily trapped by the bottom end part of the floating gate and the tunnel dielectric film is easily broken.

BRIEF DESCRIPTION OF THE DRAWINGS

FIGS. 5A to 5C are cross-sectional views of a manufacturing method following FIG. 4D.

DETAILED DESCRIPTION

A semiconductor storage device according to an embodiment comprises active areas on a semiconductor substrate. An element isolation is arranged between the active areas and filled by an insulating film. A plurality of memory cells configured to store data are formed on the active areas. Air gaps are arranged between upper-end edge parts of the active areas where the memory cells are formed and an insulating film in the element isolation.

Embodiments will now be explained with reference to the accompanying drawings. The present invention is not limited to the embodiments.

Figure 1:
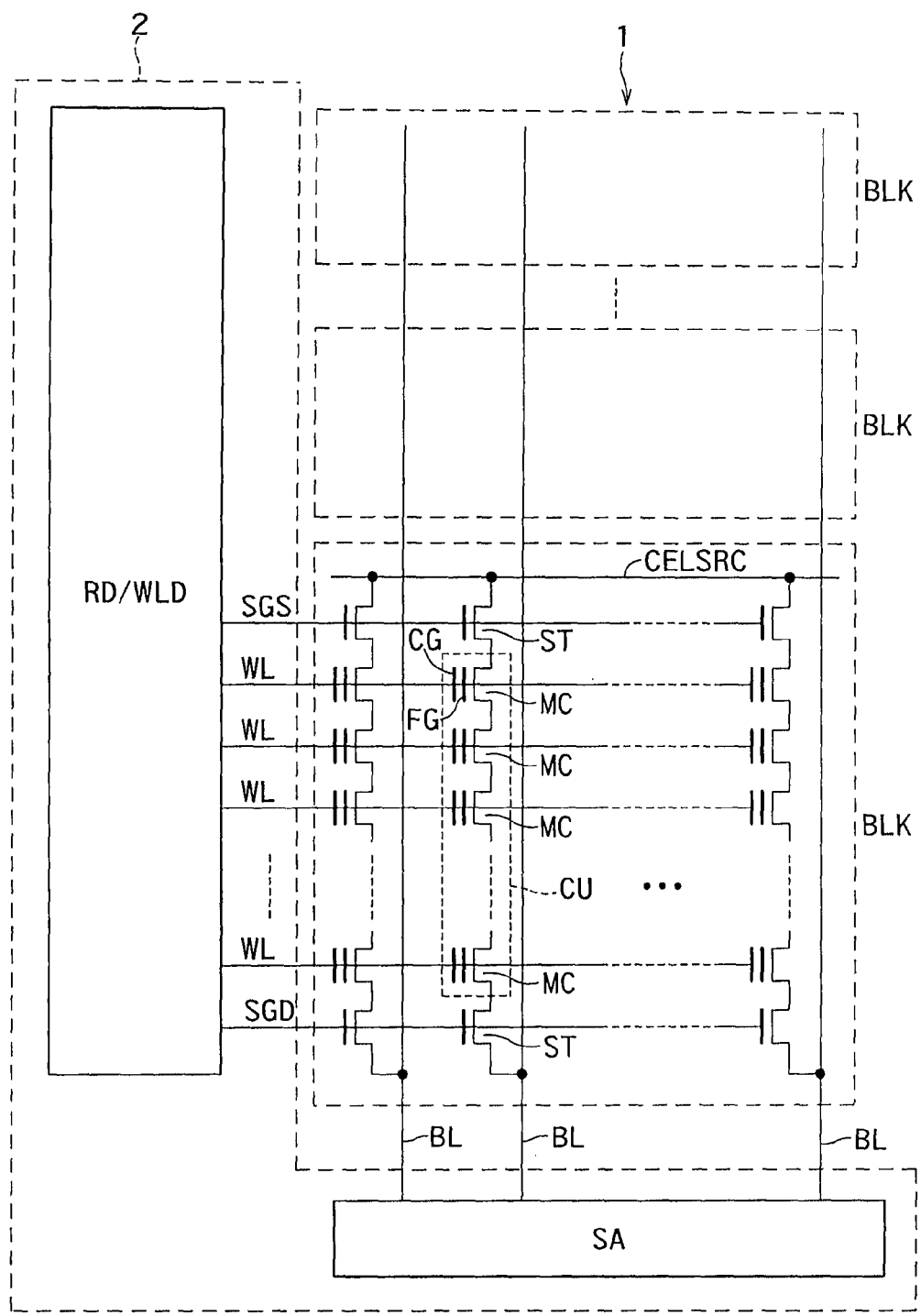
FIG. 1 shows a configuration of a semiconductor storage device according to an embodiment.

FIG. 1 shows a configuration of a semiconductor storage device according to an embodiment. The semiconductor storage device is a NAND flash memory (hereinafter, also simply "memory"), for example. The memory includes a memory cell array 1 where a plurality of memory cells MC are two-dimensionally arranged in a matrix and a peripheral circuit region 2 that controls the memory cell array 1.

The memory cell array 1 includes a plurality of blocks BLK, and each of the blocks BLK includes a plurality of memory cell units (hereinafter, also simply "cell units") CU. The block BLK is a data deletion unit. Each of the cell units CU includes the memory cells MC serially connected to each other. Memory cells MC at ends of the cell unit CU are connected to selective transistors ST. A memory cell MC at one end is connected via a selective transistor ST to a bit line BL, and another memory cell MC at the other end is connected via a selective transistor ST to a cell source CELSRC.

Word lines WL are connected to control gates CG of the memory cells MC arranged in a row direction. Selective gate lines SGS and SGD are connected to gates of the selective transistors ST. The word lines WL and the selective gate lines SGS and SGD are driven by a row decoder and a word line driver WLD.

Each bit line BL is connected via the selective transistor ST to the cell unit CU. Each bit line BL is also connected to a sense amplifier circuit SA. The plurality of memory cells MC connected to a word line are constituent elements of a page serving as a unit of reading and writing data at a time.

By driving the selective transistors ST by the selective gate lines SGS and SGD, the cell unit CU is connected between the bit line BL and the cell source CELSRC. Further, by driving unselected word lines WL by the word line driver WLD unselected memory cells MC are turned on. Accordingly, the sense amplifier SA can apply a voltage to the selected memory cell MC via the bit line BL. In this way, the sense amplifier SA can detect data of the selected memory cell MC or write data in the selected memory cell MC.

Figure 2:
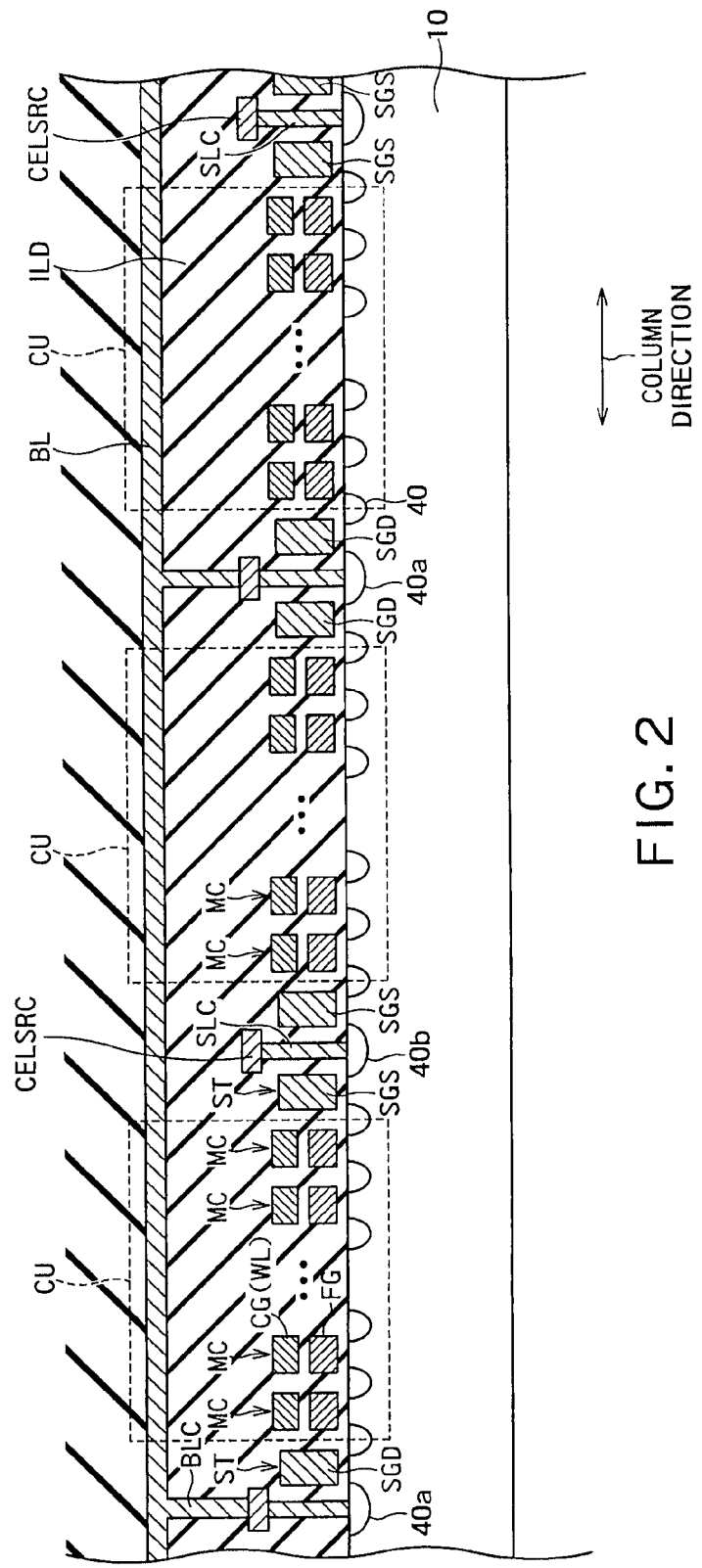
FIG. 2 is a cross-sectional view of a memory along an extending direction of the bit line BL.

FIG. 2 is a cross-sectional view of a memory along an extending direction of the bit line BL. The memory cell MC and the selective transistor ST are formed on a semiconductor substrate 10. The cell unit CU indicated by a broken line frame includes plural memory cells MC serially connected to each other by a diffusion layer (source/drain region) 40.

The bit line BL is connected via a bit line contact BLC to a diffusion layer 40a of the selective transistor ST on a drain side. The cell source CELSRC is connected via a source line contact SLC to a diffusion layer 40b of the selective transistor ST on a source side.

The word line WL that functions as the control gate CG and the cell source CELSRC extend in a direction perpendicular to the bit line BL (a direction vertical to the diagram of FIG. 2 (a row direction)).

Plural cell units CU adjacent to each other in the extending direction of the bit line BL (a column direction) share either the bit line contact BLC or the source line contact SLC.

Figure 3:
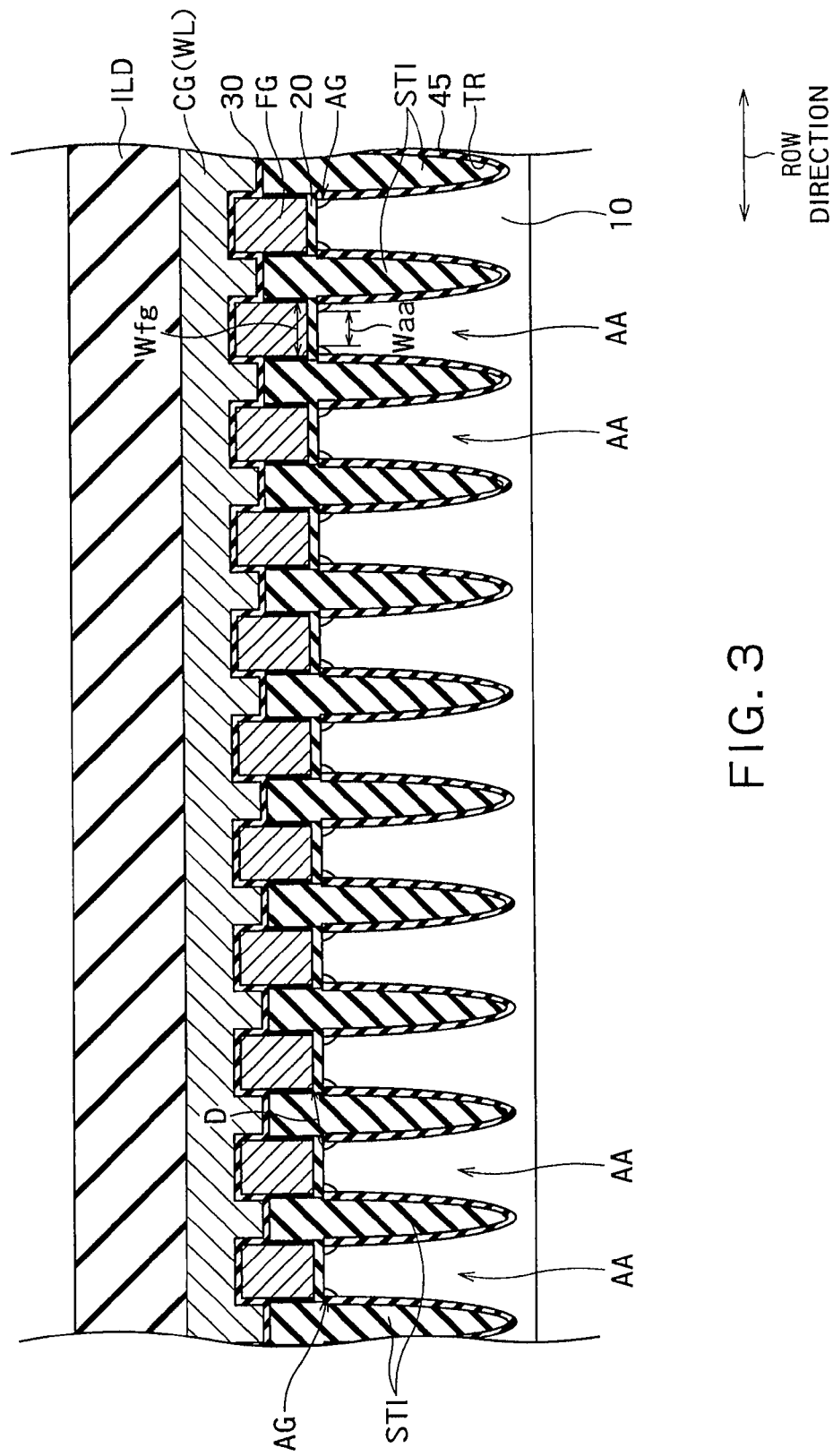
FIG. 3 is a cross-sectional view of a memory cell array along an extending direction of the word line WL.
Figures 4A, 4B, 4C, 4D:
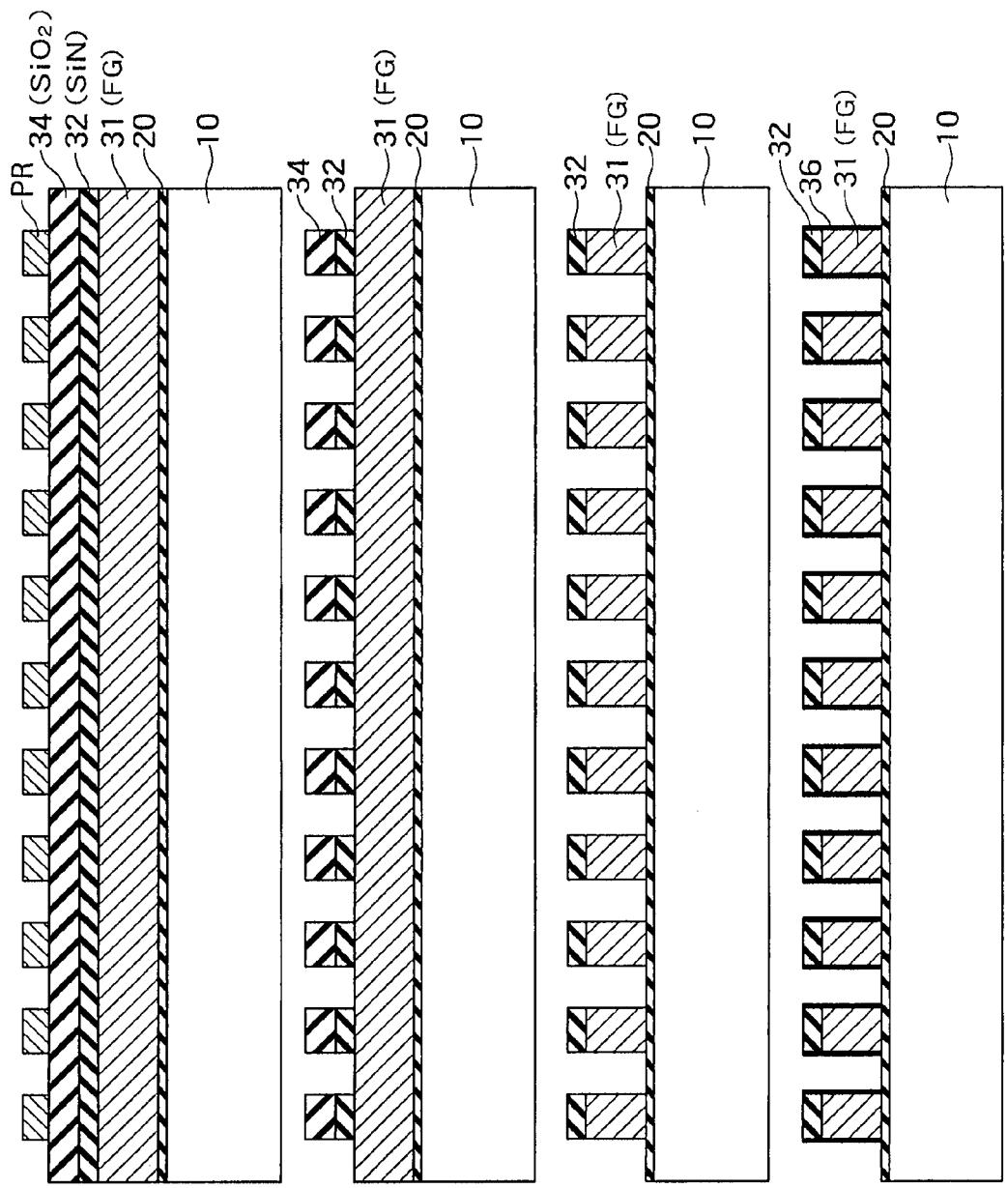
FIGS. 4A to 4D are cross-sectional views of a manufacturing method of a memory according to the present embodiment.

FIG. 3 is a cross-sectional view of a memory cell array along an extending direction of the word line WL. The memory cells MC adjacent to each other in the extending direction of the word line WL (the row direction) are separated from each other by an element isolation STI. The element isolation STI is provided between active areas AA adjacent to each other in the row direction. The active area AA extends in the column direction with the element isolation STI and the memory cell MC is formed on a surface of the active area AA.

Each of the memory cells MC includes a tunnel dielectric film 20, a floating gate (charge storage layer) FG, a gate dielectric film 30, and the control gate CG (the word line WL). The tunnel dielectric film 20 is provided on the active area AA of the semiconductor substrate 10. The floating gate FG is provided on the tunnel dielectric film 20 and separated for each of the memory cells MC in the row and column directions. The gate dielectric film 30 (IPD (Inter-Poly Dielectric)) is formed on top and side surfaces of the floating gate FG and separates the floating gate FG from the control gate CG. The control gate CG is provided upward and side of the floating gate FG with the gate dielectric film 30 interposed therebetween. The control gate CG extends in the row direction and is shared by plural memory cells MC included in the same page. In addition, the control gate CG also functions as the word line WL. An interlayer dielectric film ILD is provided on the control gate CG. A wiring such as the bit line BL (not shown in FIG. 3) is formed on the interlayer dielectric film ILD.

An air gap AG is provided between an upper end part of the active area AA and an insulating film filled in the element isolation STI. The air gap AG is a space surrounded by a spacer 45 covering an inner wall surface of the element isolation STI, the semiconductor substrate 10 (the active area AA), and the tunnel dielectric film 20. The air gap AG is formed by etching an upper end of the active area AA in a direction parallel to (laterally with respect to) a top surface of the active area AA. The air gap AG is formed on a part of the top surface of the active area AA where at least the memory cell is formed.

In the cross-section in the row direction shown in FIG. 3 (the cross-section in a direction perpendicular to the extending direction of the active area AA), a width Waa of the top surface of the active area AA is narrower than a width Wfg of a bottom surface of the floating gate FG opposing to the top surface of the active area AA. In the memory cell array region, the active area AA and the element isolation STI extend in the column direction. Accordingly, in the memory cell array region, the area of the top surface of the active area AA is narrower than that of the bottom surface of the floating gate FG. As viewed from above the surface of the semiconductor substrate 10, an outer edge of the top surface of the active area AA in the column direction is thus inside an outer edge of the bottom surface of the floating gate FG.

With this configuration, a lower-end edge part of the floating gate FG opposes not the top surface of the active area AA but the air gap AG. That is, the air gap AG is provided first below the lower-end edge part of the floating gate FG and then the semiconductor substrate 10 is provided under the air gap AG. As a result, a distance between the lower-end edge part of the floating gate FG and the active area AA can be extended, and thus concentration of an electric field on the lower-end edge part of the floating gate FG can be suppressed and trapping of electric charges and breakdown of the tunnel dielectric film 20 can be suppressed. This can improve the reliability of the entire memory.

Further, according to the present embodiment, the air gap AG extends a distance D between the active area AA of a certain memory cell MC (a first memory cell) and the floating gate FG of a memory cell MC adjacent to the first memory cell MC in the row direction (a second memory cell). Accordingly, a phenomenon that a voltage of the floating gate FG of the second memory cell MC inverts a channel of the first memory cell MC (an adjacent interference effect) can be suppressed.

FIGS. 4A to 4D are cross-sectional views of a manufacturing method of a memory according to the present embodiment.

The tunnel dielectric film 20 is formed first on the semiconductor substrate (for example, a silicon substrate) 10. For example, a silicon oxide film is used for the tunnel dielectric film 20.

Next, a material 31 for the floating gate FG is deposited on the tunnel dielectric film 20. For example, polysilicon is used for the material 31 for the floating gate FG. A cap material 32 is then deposited on the material 31 for the floating gate FG. For example, a silicon nitride film is used for the cap material 32. A mask material 34 is deposited on the cap material 32. For example, a silicon oxide film is used for the mask material 34. The cap material 32 can be used as a mask material with the mask material 34.

A photoresist PR is further formed on the mask material 34 by lithography. The photoresist PR is patterned in order to cover the active area AA. Consequently, the configuration shown in FIG. 4A can be obtained.

Next, the mask material 34 and the cap material 32 are processed in a pattern of the active area AA by RIE (Reactive Ion Etching) by using the photoresist PR as a mask. Consequently, the configuration shown in FIG. 4B can be obtained.

Next, the material 31 for the floating gate FG is anisotropically etched by RIE by using the mask material 34 and/or the cap material 32 as a mask. Consequently, the configuration shown in FIG. 4C can be obtained.

Next, a protection film 36 is formed on a side surface of the material 31 for the floating gate FG. For example, the protection film 36 can be formed by thermally oxidizing the side surface of the material 31 for the floating gate FG. Alternatively, the protection film 36 can be formed by depositing a silicon oxide film. Consequently, the configuration shown in FIG. 4D can be obtained.

Next, the tunnel dielectric film 20 is etched by using the cap material 32 or the material 31 for the floating gate FG as a mask, so that the surface of the semiconductor substrate 10 is exposed. Thereafter, by using the cap material (the mask material) 32 and the tunnel dielectric film 20 as a mask, the semiconductor substrate 10 is etched under conditions of weak anisotropy and ideally isotropically. Consequently, as shown in FIG. 5A, a recess RCS is formed under the floating gate FG or the tunnel dielectric film 20.

Isotropic etching of the semiconductor substrate 10 can be achieved by, for example, making an etching gas atmosphere high to weaken straightness of ions in RIE. Alternatively, the isotropic etching of the semiconductor substrate 10 can be achieved by, for example, not applying any bias or weakly applying a bias to the semiconductor substrate 10. Furthermore, the isotropic etching of the semiconductor substrate 10 can be achieved by, for example, not adding a diluent gas such as argon (Ar) used for dilution to an etching gas or controlling an added amount thereof to increase the amount of radicals reacting with silicon.

By using this isotropic etching (the etching with weak isotropy), the semiconductor substrate 10 under the floating gate FG or the tunnel dielectric film 20 is etched also laterally. That is, the semiconductor substrate 10 is etched also in parallel to its surface under the tunnel dielectric film 20. Accordingly, the recess RCS is formed under the floating gate FG or the tunnel dielectric film 20.

In the isotropic etching of the semiconductor substrate 10, the side and bottom surfaces of the floating gate FG are protected by the protection film 36 and the tunnel dielectric film 20. Accordingly, the material 31 for the floating gate FG is prevented from being etched by isotropic etching.

Next, the semiconductor substrate 10 is anisotropically etched by RIE by using the cap material 32 as a mask, so that the trench TR is formed between the active areas AA. At this time, the trench TR is etched to a depth required as the element isolation STI. Consequently, the configuration shown in FIG. 5B can be obtained.

Next, the spacer dielectric film 45 is deposited by CVD (Chemical Vapor Deposition) not to fill the recess RCS while an inner surface of the trench TR is covered. The spacer dielectric film 45 is a silicon oxide film, for example. The spacer dielectric film 45 is deposited under conditions with an inferior covering property. For example, in order to make the covering property inferior, the temperature of the semiconductor substrate 10 is reduced under high temperature or high pressure conditions at the time of CVD. The movement of atoms deposited is thus intentionally prevented after the atoms reach the semiconductor substrate 10 and supply of the deposited atoms is made to be in a rate-controlling state. Accordingly, in the recess RCS with a narrow opening, the opening is blocked by the spacer dielectric film 45 before the spacer dielectric film 45 is deposited on the inner side thereof. The spacer dielectric film 45 is deposited on the inner side of the trench TR with a relatively wide opening. As a result, the recess RCS remains as the air gap AG.

The trench TR is then filled by an element-separation dielectric film 39. Consequently, as shown in FIG. 5C, the element isolation STI is formed.

Thereafter, the element-separation dielectric film 39 is etched back and the cap material 32 is removed. Thereafter, the gate dielectric film 30 and the control gate CG are formed. Further, by forming the interlayer dielectric film ILD and a wiring (not shown) on the control gate CG, the memory according to the present embodiment shown in FIG. 3 is completed. At the time of processing the control gate CG, the material 31 for the floating gate FG is also separated in the column direction to be processed as the floating gate FG for each of the memory cells MC.

According to the present embodiment, the air gap AG can be provided below the lower-end edge part of the floating gate FG. As a result, concentration of an electric field on the lower-end edge part of the floating gate FG can be suppressed, and trapping of electric charges and breakage of the tunnel dielectric film 20 can be suppressed.

According to the present embodiment, the air gap AG extends the distance D between the active area AA of the memory cell MC and the floating gate FG of a memory cell MC adjacent to that memory cell MC in the row direction. Consequently, the adjacent interference effect can be suppressed.

While the embodiment explained above is an embodiment related to a NAND-type flash memory, the above embodiment can be also applied to other devices such as a NOR-type flash memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   active areas on a semiconductor substrate;
   an element isolation arranged between the active areas and filled by an insulating film;
   a plurality of memory cells formed on the active areas and configured to store data; and
   air gaps arranged between upper-end edge parts of the active areas where the memory cells are formed and the insulating film in the element isolation, wherein
   upper ends of the active areas are hollowed out in a direction parallel to top surfaces of the active areas.

2. The device of claim 1, wherein top surfaces of the active areas where the memory cells are formed are narrower than bottom surfaces of charge storage layers of the memory cells opposing to the top surfaces of the active areas.

3. The device of claim 1, wherein in a cross-section in a direction perpendicular to an extending direction of the active areas, widths of top surfaces of the active areas are narrower than widths of bottom surfaces of charge storage layers of the memory cells opposing to the top surfaces of the active areas.

4. The device of claim 2, wherein in a cross-section in a direction perpendicular to an extending direction of the active areas, widths of top surfaces of the active areas are narrower than widths of bottom surfaces of charge storage layers of the memory cells opposing to the top surfaces of the active areas.

5. The device of claim 1, wherein the device is a NAND-type flash memory.

6. A manufacturing method of a semiconductor storage device comprising:
   forming a tunnel dielectric film on a semiconductor substrate;
   depositing a material for a charge storage layer on the tunnel dielectric film;
   anisotropically etching the material and the tunnel dielectric film in a pattern of an active area;
   isotropically etching the semiconductor substrate in order to form a recess under the tunnel dielectric film;
   anisotropically etching the semiconductor substrate in order to form a trench between the active areas;
   depositing a spacer dielectric film in order to cover an inner surface of the trench while the recess remains as an air gap; and
   filling the trench by an element isolation dielectric film while the air gap remains, in order to form an element isolation, wherein
   an under surface of the tunnel dielectric film is exposed when the recess is formed by the isotropically etching of the semiconductor substrate.

7. The method of claim 6, wherein isotropic etching of the semiconductor substrate is etching of the semiconductor substrate under the tunnel dielectric film in a direction parallel to a surface of the semiconductor substrate.

8. The method of claim 6, wherein the semiconductor storage device is a NAND-type flash memory.

9. The device of claim 1, wherein the plurality of memory cells are formed on the active areas via a tunnel dielectric film.

10. The device of claim 9, wherein an under surface of the tunnel dielectric film is higher than a bottom surface of the air gaps.

* * * * *